United States Patent [19]
Cameron

[11] Patent Number: 5,770,968
[45] Date of Patent: Jun. 23, 1998

[54] DIFFERENTIAL AMPLIFIER WITH PROXY LOAD FOR CONTROL OF OUTPUT COMMON MODE RANGE

[75] Inventor: Scott Warren Cameron, Milpitas, Calif.

[73] Assignee: SGS-Thomson Microelectronics, Inc., Carrollton, Tex.

[21] Appl. No.: 366,790

[22] Filed: Dec. 30, 1994

[51] Int. Cl.$^6$ .................................. G11B 5/02; H03F 3/45
[52] U.S. Cl. .......................... 327/538; 327/73; 327/563; 360/67; 360/113; 330/260
[58] Field of Search ...................................... 327/561–563, 327/67, 316, 323, 73, 87, 538, 540, 541, 60; 330/260, 261, 258, 291; 360/67, 113

[56] References Cited

U.S. PATENT DOCUMENTS

| | | | |
|---|---|---|---|
| 4,551,772 | 11/1985 | Sliger . | |
| 4,667,166 | 5/1987 | Itoh | 330/260 |
| 4,879,610 | 11/1989 | Jove . | |
| 5,103,353 | 4/1992 | Jove et al. | 360/67 |
| 5,204,789 | 4/1993 | Jove et al. | 360/67 |
| 5,309,295 | 5/1994 | Bailey et al. . | |
| 5,327,303 | 7/1994 | Smith . | |
| 5,404,097 | 4/1995 | Barou | 330/260 |
| 5,444,579 | 8/1995 | Klein et al. | 360/67 |
| 5,471,169 | 11/1995 | Dendinger | 327/563 |

FOREIGN PATENT DOCUMENTS

| | | |
|---|---|---|
| 0121027 | 10/1984 | European Pat. Off. . |
| 0215270 | 3/1987 | European Pat. Off. . |
| 2105093 | 8/1982 | United Kingdom . |

OTHER PUBLICATIONS

IBM Technical Disclosure Bulletin, vol. 23, No. 10, Mar. 1981, New York pp. 4718–4719, "Read Preamplifier for a Magnetic Head".

IBM Technial Disclosure Bulletin, vol. 34, No. 7A, Dec. 1991, New York, pp. 141–142, Anonymous, "Electrical Bias of Disk Assembly for Preventing Magneto–resistive Sensor Damage".

IBM Technical Disclosure Bulletin, vol. 37, No. 2A, Feb. 1994, New York pp. 147–148, Anonymous, "Bidirectional Magneto–Resistive Bias Generator with Symmetrical Output".

IEEE Journal of Solid–State Circuits, Dec. 1994, vol. 29, NR, 12, pp. 1589–1595 Klein et al., "A 0.8nV/square root Hz CMOS preamplifier for IC–magneto–resistive read elements".

Patent Abstracts of Japan, vol. 10, No. 48(P431), Feb. 25, 1986.

Robinson, Klein, Palla, Chung, "A 0.8nV/VHz CMOS Preamplifier . . . " 1994 IEEE Int'l Solid State Circuits, p. 252.

Saito et al., "Development of a Magnoresistive/Inductive Head . . . " IEICE Trans. Fund., vol. E76A, No. 7, Jul. 1995, p. 1167.

(List continued on next page.)

*Primary Examiner*—Timothy P. Callahan
*Assistant Examiner*—Eunja Shin
*Attorney, Agent, or Firm*—David V. Carlson; Theodore E. Galanthay; Lisa K. Jorgenson

[57] ABSTRACT

An innovative differential amplifier circuit, which can control the midpoint potential of a load which does not itself have any midpoint connection. This is achieved by using a proxy load element in parallel with the primary load. The proxy load is of much higher impedance value than the primary load, and does have a center tap. The potential of the center tap of the mirrored load is used for a feedback connection to a control loop which regulates the output to both the primary load and the proxy load.

5 Claims, 9 Drawing Sheets

OTHER PUBLICATIONS

Rohen, "Wave Shaping Circuit for a Magnoresistive Read Head" IBM Tech. Disclosure Bulletin, vol. 21, No. 3, Aug. 1978, p. 984.

Jones, "Magnoresistive Amplifier" IBM Technical Disclosure Bulletin, vol. 20, No. 10, Mar. 1978, p. 4114.

Oestel et al., "Read–out of a magnetic tape by the magnetoresistance effect" Rev. 37, No. 2.3, p. 43, 1977.

IBM Technical Disclosure Bulletin, "Accurate Biasing of Bipolar Dift. Amp. with CMOS Feedback Circuit", vol. 38 No. 08 Aug. 1995.

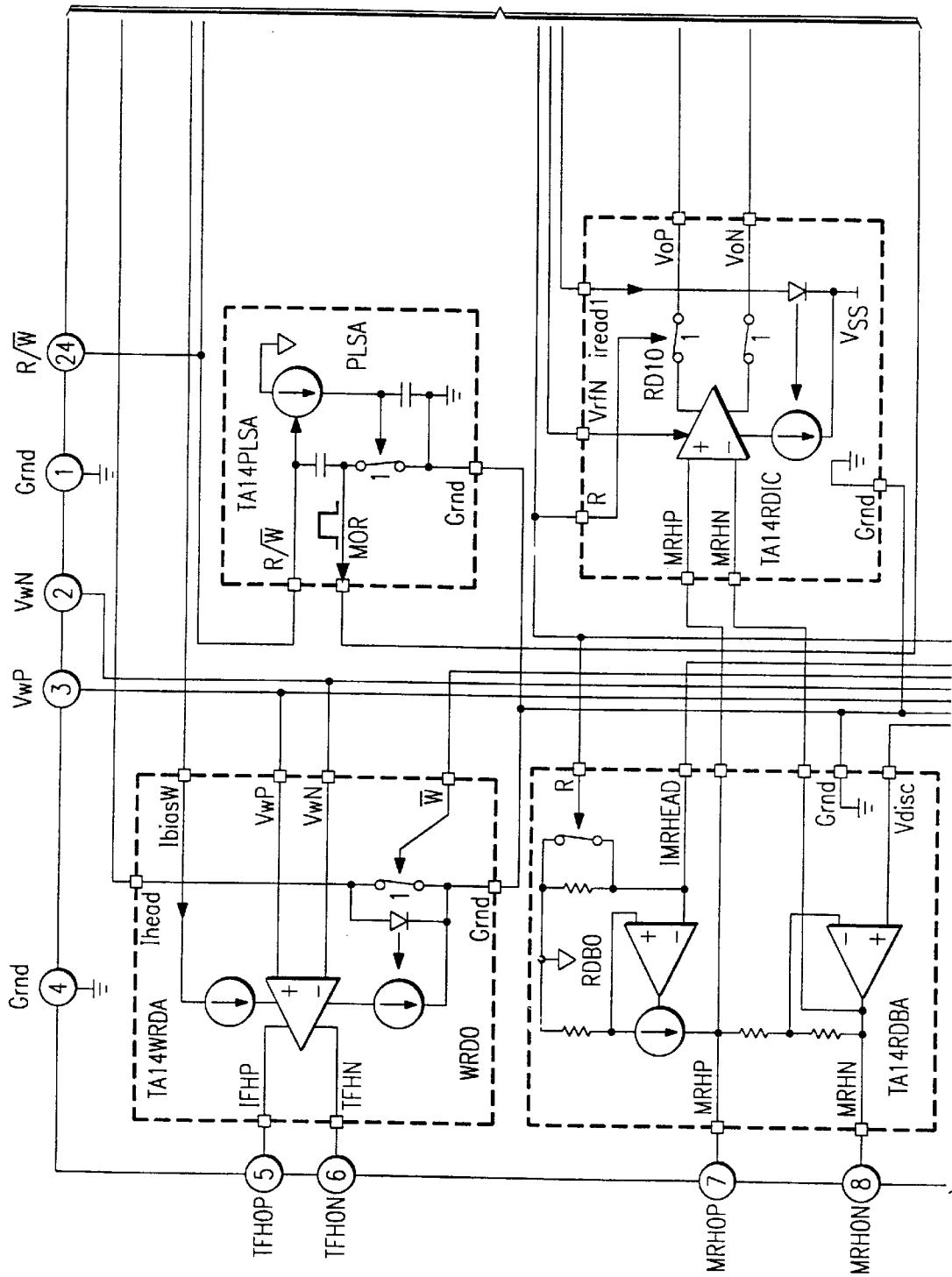

DIFFERENTIAL AMPLIFIER WITH PROXY LOAD FOR CONTROL OF OUTPUT COMMON MODE RANGE

BACKGROUND AND SUMMARY OF THE INVENTION

The present invention relates to circuits, and particularly to integrated circuits, for interfacing to magnetoresistive read elements.

Magnetoresistive Heads

Magnetoresistance is a solid-state phenomenon wherein the resistance of an element is affected by the magnetic field around it. This physical phenomenon has been discussed for some years as a way to read the data which is stored in magnetic patterns in tape and disk drives. Disk drive manufacturers have now developed the fabrication technology to manufacture magnetoresistive drives on a large scale.

In a disk drive, traditionally the head was a coil (or more recently a thin film head which is equivalent to a coil), imbedded in some form of a head that slid across the top of the disk platter, and positioned to create a magnetic field in a small area of the surface of the platter. By controlling the amount of current that flows to the coil, and switching it from one direction to the other direction, a series of magnetic dipoles would be created in the ferrimagnetic medium at the surface of the disk. That exact same coil would also be used in the read-back mode, to detect changes in the magnetic field vector of the magnetic medium.

Normally a "1" is indicated, on the disk, by a transition in the magnetic field. No transition would imply a zero. (These transitions are synchronized in ways not relevant here.) In the read-back mode, the coil becomes a BEMF generator, and a change in magnetic flux (due to crossing a domain boundary in the medium) will induce a voltage on the coils, which is sensed and amplified to detect the changes in the magnetic structure of the medium. This sensed voltage therefore provides a readout of the information stored in the magnetic medium, without disturbing it.

A disk drive normally includes multiple head elements each mounted on respective arms. The arms move across the disk and trace out various rings of magnetic data. If we could see the magnetic domain boundaries in the magnetic medium on the disk, we would see chains of overlapping circles, almost like overlapping punch-outs, where the write head changed its magnetic field and pushed out a new flux domain. The written domains are spaced closely enough to overlap (and therefore very few of them are circular), but there is enough remaining area in each one to preserve the written data.

If we are reading back with the same coil, then we have to make sure we have a space between the tracks of data, so that the magnetic flux of the adjacent track cannot interfere with coil readings. This intertrack separation requirement limits the density, so that in effect the density has an ultimate limit defined by the dimensions of our thin film head.

However, if we could somehow read a narrower stripe than the written strip, we could avoid intersymbol interference between adjacent tracks. Thus the limiting factor in traditional systems is not the writing, but the fact that traditional systems have to read back with the same inductive element. If we could read back using a sensor with smaller width (i.e. that magnetically coupled to a narrower area of the disk's magnetic medium), then we could reduce the track-to-track spacing. Even while using the same inductive element for writing, and writing with the same data frequency, we can write adjacent tracks closer together, so that the circular magnetic domains of adjacent tracks actually overlap.

The magnetoresistive ("MR") head has a very narrow strip to it. (In fact, MR heads are actually fabricated with integrated circuit fabrication technology.) Thus, MR heads provide a way to read magnetic data which is very closely spaced (with very close track-to-track spacings) without intersymbol interference. By contrast, if we were to try to read this pattern back with a thin film head, we would get a tremendous amount of intersymbol interference, and we would not get a reliable read-back. (An example of a modern MR head design is shown in Saito et al., "Development of a magnetoresistive/inductive head and low noise amplifier IC for high density rigid disk drives," E76-A IEICE TRANSACTIONS ON FUNDAMENTALS OF ELECTRONICS, COMMUNICATIONS AND COMPUTER SCIENCES 1167-9 (1993), which is hereby incorporated by reference.) The MR sensing element, basically, is a strip in the head which has a variable resistance which is affected by the ambient magnetic field. To sense this variable resistance, it is biased with a constant current: changes in the resistance will then appear as a voltage change. Since the MR sensing element is a physically narrow strip, it can ride right down the middle of the track, and avoid most of the intersymbol interference from the overlap at the edges of the tracks. Also, the readout from an MR head is not a function of the transitions (as with a sensing coil), but simply a function of the magnitude of the magnetic field.

Biasing and Interfacing to the MR Head

Thus magnetoresistive ("MR") head technology promises to produce a new generation of disk drive density. However, the interface requirements to an MR head are significantly different from those of conventional read heads. The bias current through the magnetoresistive element must be set so as to optimize the operating point of the read elements.

State-of-the-art tape drives also employ MR heads, to achieve the advantage of speed-independent signal amplitude as well as increased bit density. In such systems, since the preamplifier may have to support simultaneous reading from a number of MR elements, power consumption may also be an important consideration.

Background on MR head and preamplifier technology may be found, e.g., in Rohen, "Wave-shaping circuit for a magnetoresistive read head, " 21 IBM TECHNICAL DISCLOSURE BULLETIN 984-5 (Aug.1978); Jones, "Magnetoresistive amplifier," 20 IBM TECHNICAL DISCLOSURE BULLETIN 4114-15 (March 1978); van Gestel et al., "Read-out of a magnetic tape by the magnetoresistance effect," 37 PHILIPS TECH. REV. 42–50 (1977, no.2–3); Robinson et al., "A 0. 8 nV/ square root Hz CMOS preamplifier for magneto-resistive read elements," 1994 ISSCC 252-3; all of which are hereby incorporated by reference.

DC Voltage Potential from Head to Disk

However, magnetoresistive heads do have a problem which is not present in conventional inductive heads: consider the implications of the proximity of the head to the disk. In the case of the inductive element, the inductive element could be insulated. It didn't have to ride as close to the outer surface of the head, and electrically, it never came in contact with the head. (Some form of a nonconductive ferrimagnetic core is usually used, to focus the fields into the magnetic medium.) Such a core doesn't really have a forced potential, but floats electrically; therefore if the core touches the disk, current doesn't flow from the coils to the core in the disk.

However, with the MR head element that's not true. The magnetoresistive element is literally a resistor, and it has to ride close to the surface. Since the resistor is carrying a current, at least some parts of the sensing element will have a significant potential with respect to the disk surface. The distance between the head and the media is very small—on the order of microns—and when the disk is stopped, the head comes in contact with the media. Thus we have two problems:

1) Contact: when the head comes into contact with the media, it can short, and we have to design current limiting into our scheme so that only a certain amount of current will flow onto the disk; otherwise, a significant current may flow onto the disk, and if the head stops in a place where there's data then this current may destroy the data.

2) Arcing: while the head is flying, it may generate a potential from the head to the disk and cause arcing.

The traditional approach is to control the amount of current flowing in the head. The head impedance is very small, on the order of 12 ohms. The current sources have output impedances (effectively in parallel with the current sources of about 10 milliamps) on the order of about 100KΩ. In this example, the 10 milliamps of bias current times the 12 ohms would give a DC drop of about 120 millivolts across the sensing element. (In some applications the resistance may be as high as 32 ohms and the bias current 16 milliamps; so under these worst-case conditions the voltage across the sensing resistance may be as high as 512 mV.) This 120 millivolts (or more) may be thought of as quasifloating: the sensing element sees a relatively high impedance to ground or to supply. We can clamp the potential of one end of the sensing element to ground, as shown in FIG. 1A, by using an op amp in a feedback situation. The other end of the sensing element therefore goes to 120 millivolts relative to ground, so the voltage from the head to the medium will never be greater than 120 mV.

This solution was satisfactory for some applications; but now consider the case of 16 milliamps drive and 32 ohms sensor resistance. This implies a voltage drop of 500+ millivolts, which is large enough to cause arcing.

Midpoint Biasing of Magnetoresistive Head

The innovative disclosed solution sets the common-mode bias of the resistor terminals so that the CENTER of the resistor is at ground. This invention was facilitated by the realization that the control of the current really amounts to controlling a differential voltage on the head. If we can then regulate the common mode voltage to put the center of that head at ground, we halve the peak magnitude of the head-to-disk voltage.

FIG. 1B schematically shows the voltage relations for the magnetoresistive read operation provided by the present invention. It is still necessary to clamp the voltage of the sensing resistor, but the present invention teaches clamping the center point of the resistor (without requiring any direct connection thereto). Thus, with the head parameters of FIG. 1A, FIG. 1B shows a different set of potentials, where the peak voltage to ground is only 60 mV instead of 120 mV.

The voltage which will cause arcing is dependent on the specific system used, but will typically be in the neighborhood of 400 millivolts or so with the drive configurations currently used. (In fact there are two kinds of arcing: one causes physical damage, and the other causes media damage. However, that difference is not relevant here, since the present invention is intended to avoid damage from either type of arcing.) To provide some margin of safety, the peak head-to-disk voltages should preferably less than ±300 millivolts.

Several circuits are described for achieving this innovative control relation. This provides a magnetoresistive disk drive system with reduced susceptibility to arcing.

Circuit Implementation

To achieve this midpoint biasing of the MR head, the present application provides an innovative differential amplifier circuit, which can control the midpoint potential of a load which does not itself have any midpoint connection.

This is achieved by using a proxy load element in parallel with the primary load. The proxy load is of much higher impedance value than the primary load, and does have a center tap. The potential of the center tap of the mirrored load is used for a feedback connection to a control loop which regulates the output to both the primary load and the proxy load.

Preferably this is implemented in a circuit which uses asymmetrical emitter degeneration. In general, in applications where harmonic distortion and balanced outputs are needed, emitter degeneration resistors would be connected to both emitters of a differential pair. However, in the MR biasing stage of the present invention, the crucial objective is simply to control the current flowing in the head.

Thus in the disclosed innovative circuit the head is connected as an emitter degeneration on one side of the differential pair, to provide an UNbalanced differential pair. A differential voltage is accordingly applied to the emitter differential pair, and this will cause the bias current to be steered primarily through the head, with part of the bias current still going through the other side (to keep operation in the linear regime).

A cascaded pair of higher-value "proxy" loads is interposed in the lower-current side. (In the presently preferred embodiment these have about 100x the value of the primary load, but of course this ratio can be changed.) The point between these proxy loads provides a proxy for the midpoint of the primary load, even when the primary load does not itself have a center tap.

The center tap voltage from the proxy loads is then used as an input to a differential amplifier, which controls the bias current so that the voltage of the magnetoresistive sensing element stays in the desired range.

In some embodiments this is implemented using a double control loop circuit:

one control loop drives a differential signal onto the bases of the differential NPN pair, to provide a precise bias current to the leg which includes the MR head (and also the proxy load); and the other control loop controls the common-mode voltage of the bases of the differential pair, to drive the center-tap voltage of the proxy loads (and hence the center of the primary load) towards ground.

In other embodiments, other control relations can be used to take advantage of the proxy load concept.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 6A, 6B, 6C, and 6D are four parts of a single drawing which shows a sample drive head interface which advantageously incorporates biasing circuitry according to FIGS. 2, 3, 4, or 5A–5C.

DETAILED DESCRIPTION OF THE PREFERRED EMBODIMENTS

The numerous innovative teachings of the present application will be described with particular reference to the presently preferred embodiment (by way of example, and not of limitation), in which:

Circuit Implementation

Figure 1A:
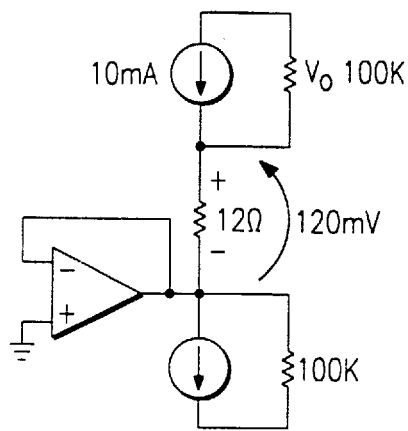
FIG. 1A schematically shows a magnetoresistive read amplifier of the prior art.
Figure 1B:
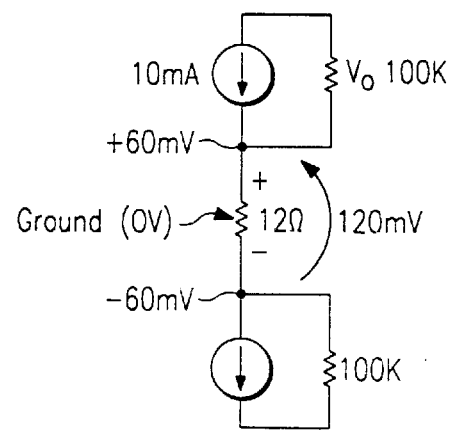
FIG. 1B schematically shows the voltage relations for magnetoresistive read operation provided by the present invention.
Figure 2:
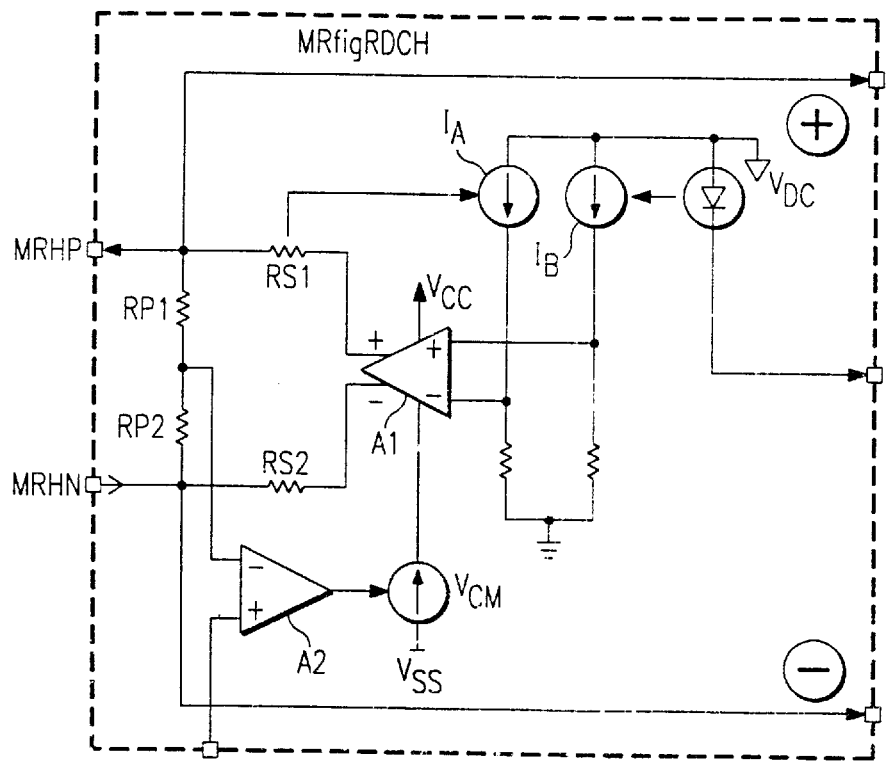
FIG. 2 conceptually shows a first embodiment of the invention.

FIG. 2 conceptually shows a first embodiment of the invention. In this embodiment a first amplifier A1 directly drives the read head (through terminals MRHP/MRHN), and also drives a pair of proxy resistors RP1/RP2 which are in parallel with the read head. The center voltage of the proxy resistors RP1/RP2 is fed into differential amplifier A2, which drives the center voltage of the proxy resistors (and hence the center voltage of the sensing element) toward ground by regulating a lower supply current to amplifier A1, and thereby setting the common mode voltage $V_{CM}$ of A1. The current passed by sensing resistor $R_{S1}$ (which is balanced by $R_{S2}$) corresponds to current source $I_A$, which drives the + input of differential-in-differential-out amplifier A1. The — (inverting) input of amplifier A1 is driven by a constant current source $I_B$. Thus amplifier A1 drives the sensing element with a constant current, at a bias voltage which is determined, using amplifier A2, so that the midpoint of the magnetoresistive sensing element is biased to match the voltage on the + input of amplifier A2 (which will typically correspond to the voltage of the disk platter).

Figure 3:
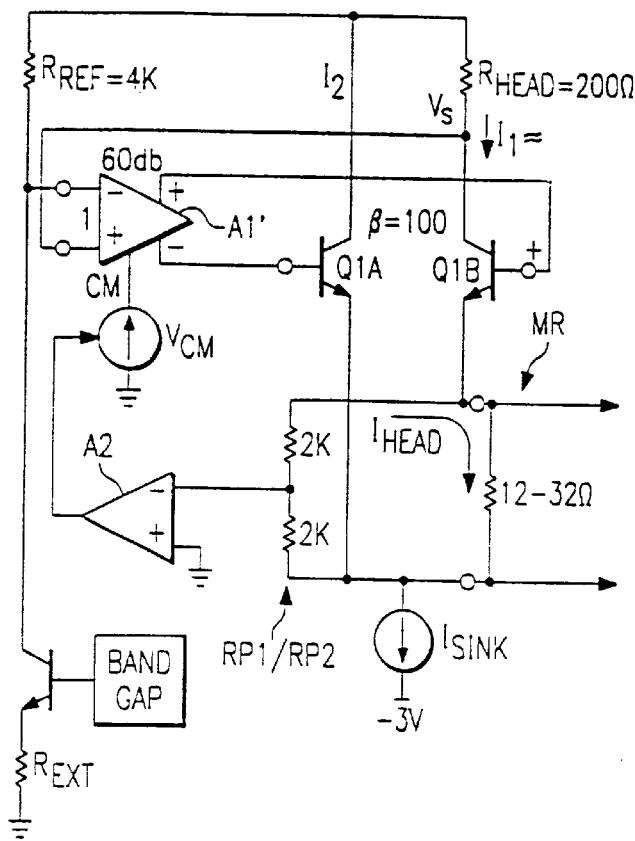
FIG. 3 shows a second embodiment of the invention.

FIG. 3 shows a second embodiment of the invention. Again, proxy loads RP1/RP2 are connected in parallel with the sensing element MR. In this embodiment a differential amplifier A1' drives the bases of a differential pair Q1A/Q1B to drive the current through Q1B to precisely equal a constant value $$\frac{V_{bg}}{R_{ext}} \left( \frac{R_{Ref}}{R_{Head}} \right).$$

Again, an additional differential amplifier A2 monitors the center voltage of the proxy loads RP1/RP2, and accordingly drives the common-mode voltage of amplifier A1' to drive the center voltage of the proxy loads (and hence the center voltage of the sensing element MR) toward ground (which of course must be referenced to the disk platter). Of course, compensation elements (not shown) are preferably used to stabilize this control loop.

In this circuit, the differential output of A1' modulates the relative emitter currents of Q1A and Q1B to control the fraction of the total current $I_{sink}$ which goes through, rather than around, the parallelled loads MR+RP1/RP2. This control loop drives the voltage $R_{Head}I_{Q1B}$ to be equal to $R_{ref}I_{ref}$:

$$\begin{aligned} R_{Head}I_{Q1B} &= R_{Ref}I_{Ref} \\ &= (V_{BG} - V_{BE})\frac{R_{ref}}{R_{ext}}. \end{aligned}$$

Thus, the current across MR is constant as desired.

Amplifier A2 regulates the common mode voltage $V_{CM}$ of A1', and thus regulates the total current passed by Q1A+ Q1B to set the potential of the midpoint of the proxy resistors RP1/RP2 (and hence of the sensing element MR). (The total current passed by Q1A+Q1B will remain close to current $I_{sink}$, but small variations in the total current passed by Q1A+Q1B will shift the voltage of the sensing element MR.)

The result of this is that the proxy loads (proxy resistors RP1/RP2 in this example) provide a mirror of the MR resistor, and thus the intermediate node of the proxy loads can be monitored to set the center voltage of the sensing element MR, which does not have a center tap.

Since the proxy load elements are much larger than the sensor value (12–32 Ω), almost all of the current will go through the MR head element. A little of it will go through the 2KΩ proxy load resistors, so it is possible to consider using even higher values for the proxy load resistors. However, the amplifier stage itself will draw some input current $I_{amp-in}$, e.g. on the order of a couple of microamps. Thus, the value $R_{proxy}$ for each proxy load resistor should not be so high that the voltage drop $R_{proxy}I_{amp-in}$ will cause the center tap voltage to shift beyond the tolerable margin of error.

For example, in the presently preferred embodiment, each $R_{proxy} = 2K\Omega$, and the amplifier input draws a current of about 100 microamps. This 100 microamps flows through the proxy loads RP1/RP2 and joins the head current Ihead. This represents 100 microamps of error in the MR head bias, but this is relatively small in comparison to the 10 milliamps of bias current passed by the MR head element. Thus, this 100 microamp error is within error limits, in the presently preferred embodiment.

To reduce that consumption, one solution is to go to a fancier amp design or tolerate more noise. This is an undesirable solution.

The biasing element actually introduces some noise in our MR element. Given a current source, the ideal picture of this MR element is that the bottom of the MR element will be driven such that the center tap goes to ground and a current is pumped through there. If that current is stable and the MR resistor is changing, a DC bias voltage will be seen on this thing due to the MR resistance element changing, a signal will be superimposed on it. If the current source remains exactly constant, then we have optimized the signal source, meaning that when the resistance changes we will see a proportional voltage. If the loop that is regulating that current is not very fast, then we get an erosion or a degradation of the signal: as we change the resistance, the voltage is forced to change, which also feeds back and causes the current to go down, lowering the amplitude of the net signal. Consequently, we want the regulation of that current source to be very stable. The problem is that this is a wide band design; it amplifies all the noise in that bandwidth so that we're not filtering any of the noise.

Noise can be reduced, if necessary, by using various well-known design tricks, such as the use of larger transistors. However, noise is generally not a primary concern in the presently preferred embodiment.

The use of an external resistor Rext allows the drive manufacturer to control the read head bias current precisely. Since the properties of magnetic media will vary between manufacturers, and may also vary as processes and materials are optimized, the bias generation circuit, in the presently preferred embodiment, provides precise mirroring of current drawn on an external pin, to accurately define the bias current applied to the MR read head. Thus, the drive manufacturer can accurately control the head bias current by changing the value of an external precision resistor to ground, or alternatively by connecting a programmable current sink to this pin. Thus the drive manufacture can change the current for different head medium characteristics.

So in effect the illustrated circuit uses the center tap voltage of the proxy loads to regulate the common mode voltage of that amplifier stage. A different way of using the measurable tap voltage is to directly drive the voltage at the bottom terminal of the sensing resistor, using a control loop which compares the measurable tap voltage to a reference voltage (such as disk platter ground).

Figure 4:
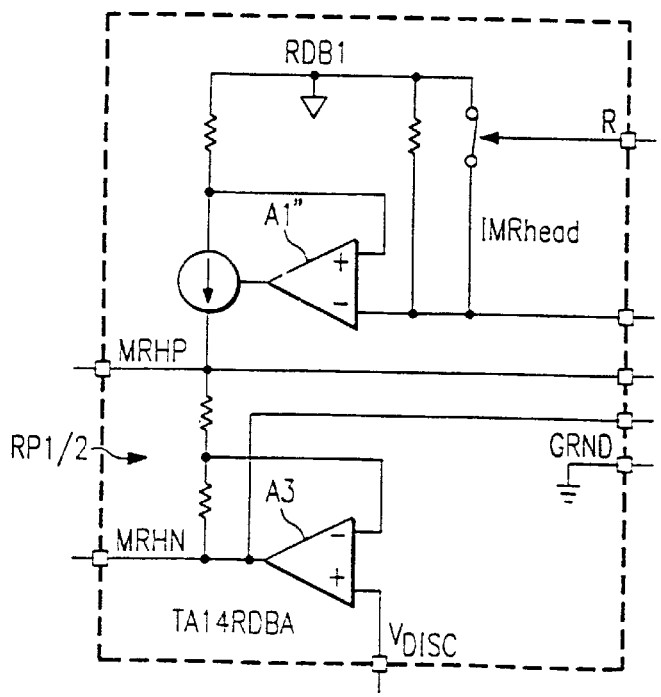
FIG. 4 shows a third embodiment of the invention.

FIG. 4 shows a third embodiment of the invention. In this embodiment, amplifier A3 simply drives the voltage of one end of the sensing element directly. Again, the center tap voltage of the sensing resistor is monitored by proxy (using proxy loads RP1/RP2), and the voltage of one end of the sensing resistor is driven directly, to equalize the center voltage of the sensing resistor to ground. In this embodiment, a $g_m$ current generator is used (differential voltage input, current output); the sense voltage is compared to a reference voltage, and the current is regulated accordingly.

Figure 5A:
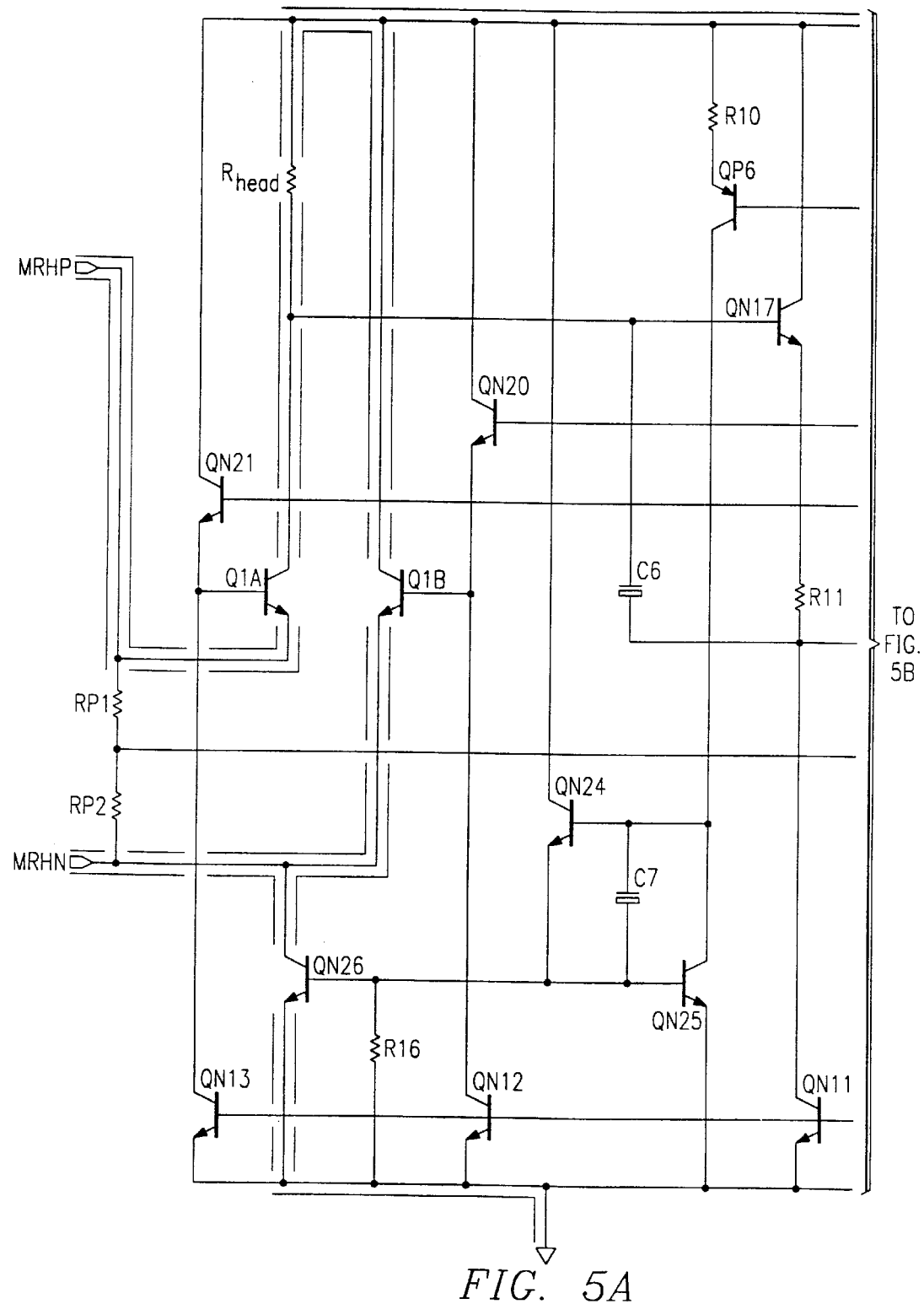
FIGS. 5A, 5B, and 5C are three parts of a single drawing, and show a sample specific implementation at the circuit level.
Figure 5B:
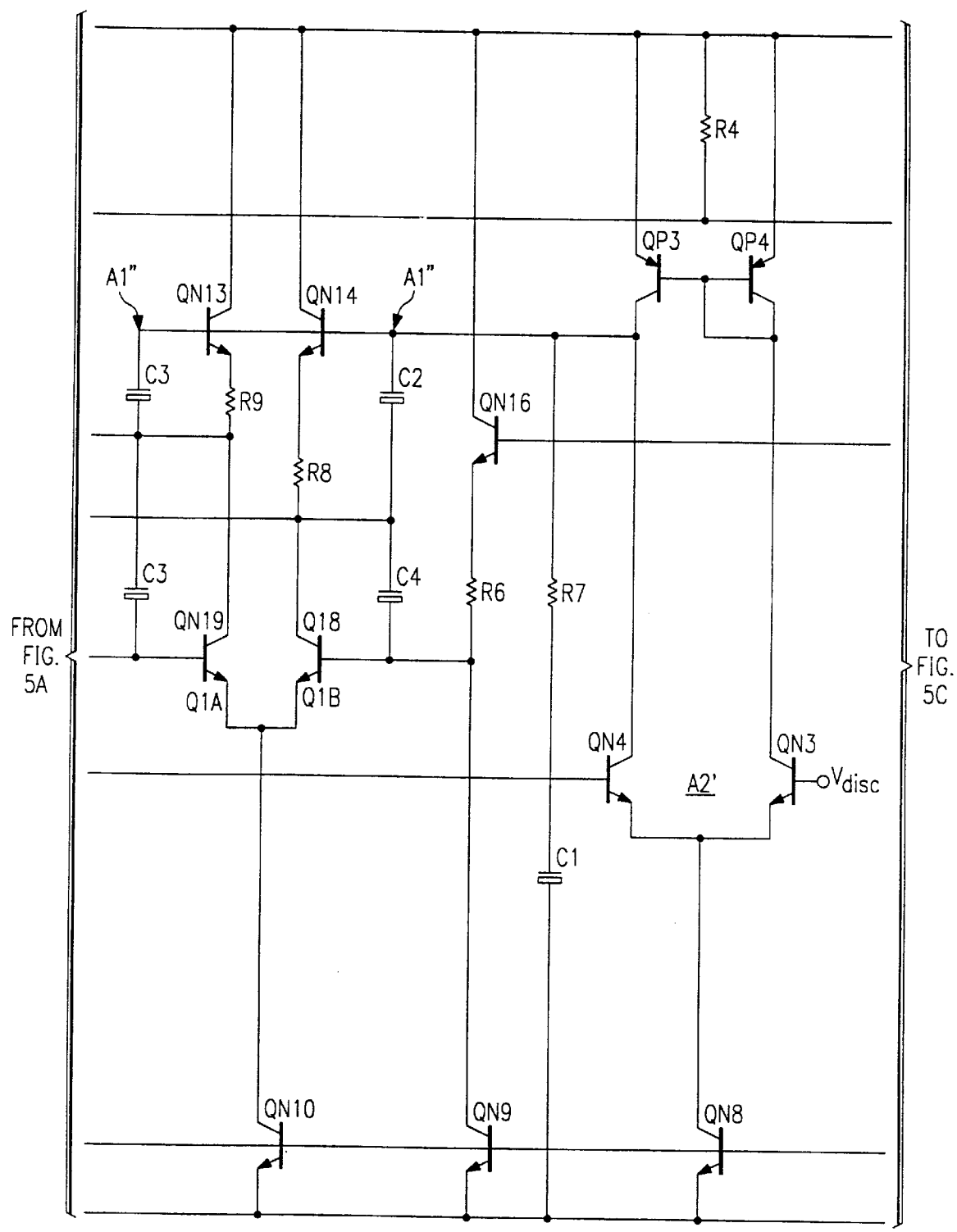
Figure 5C:
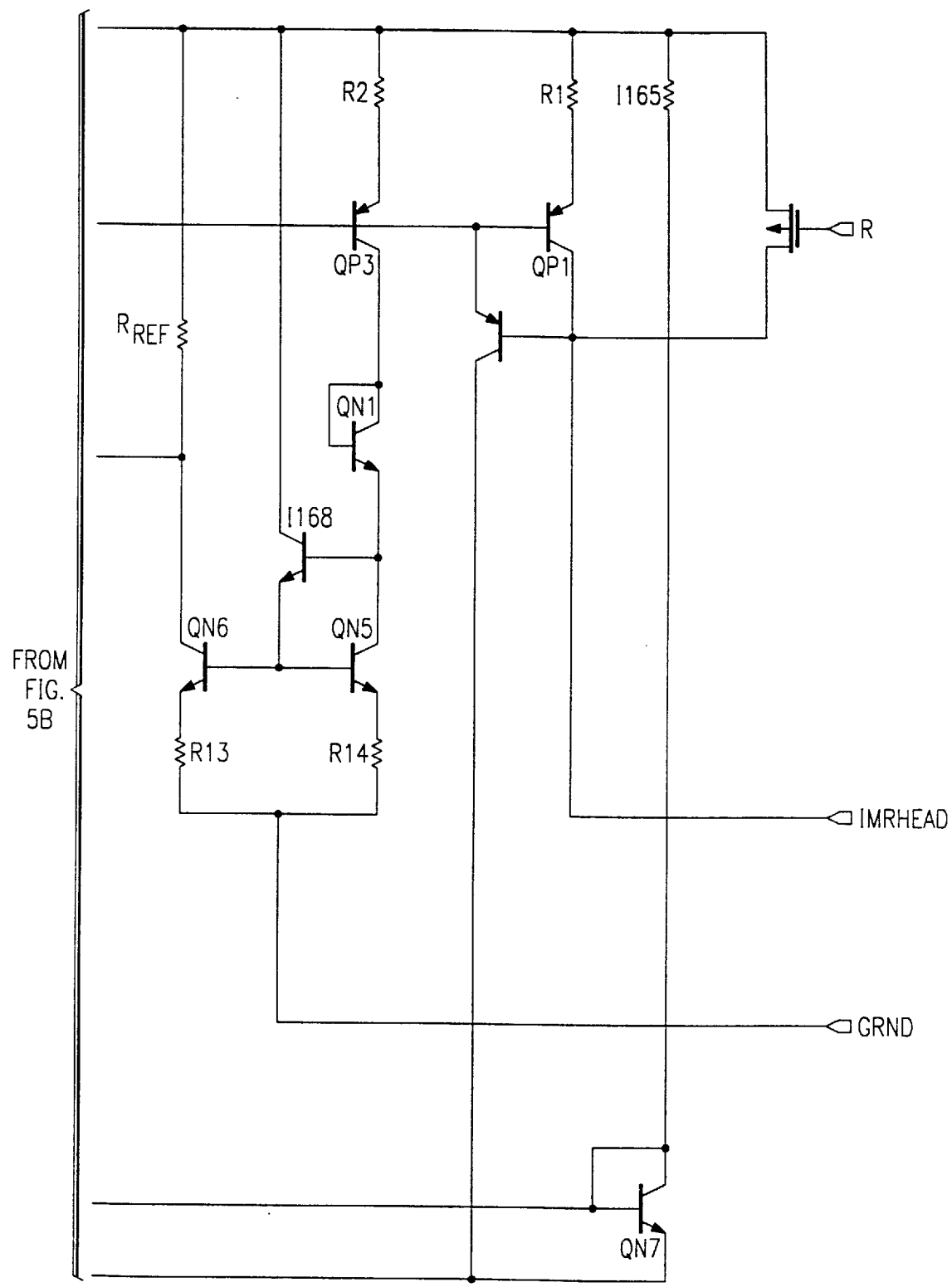
Figure 6B:
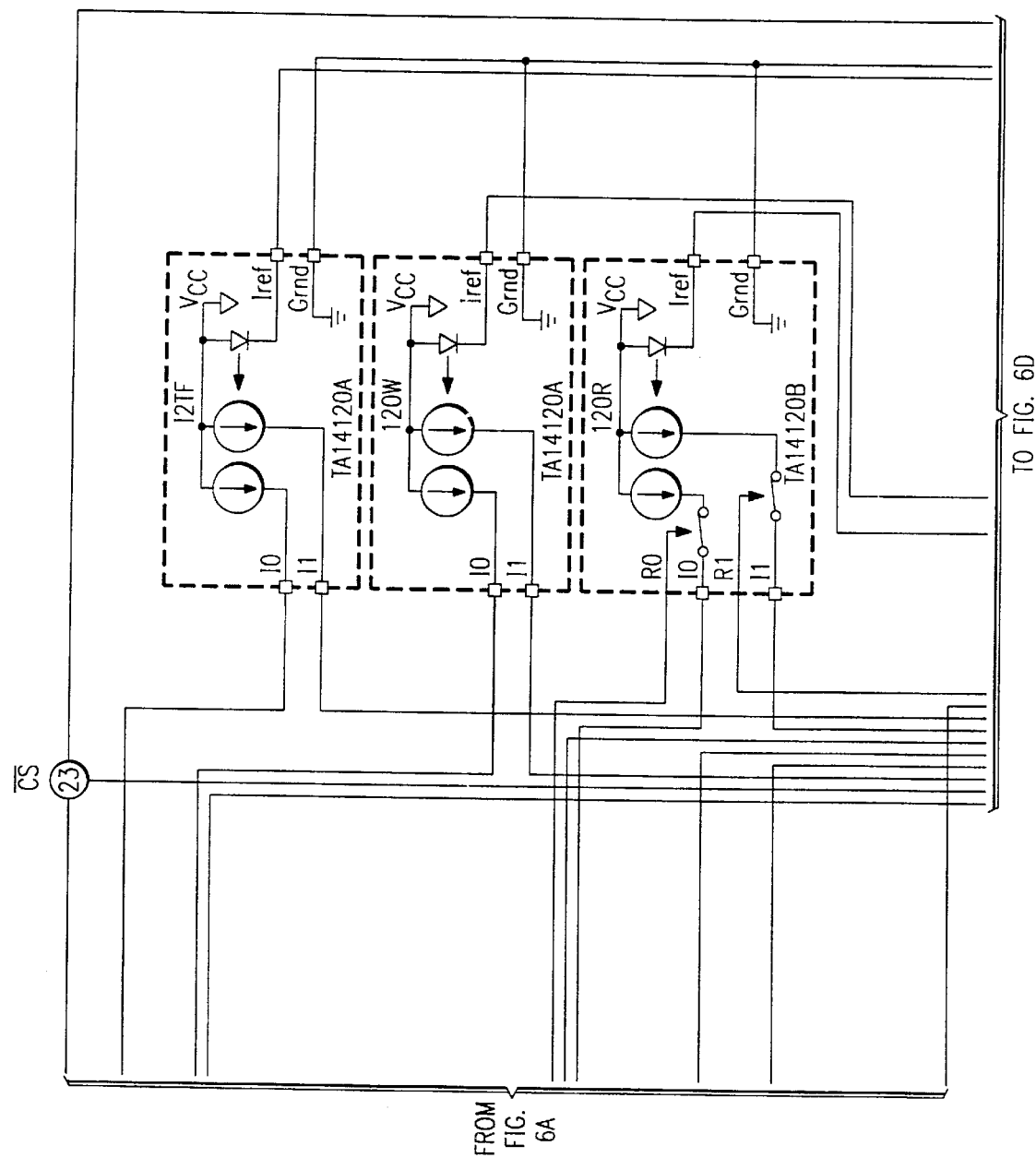
Figure 6C:
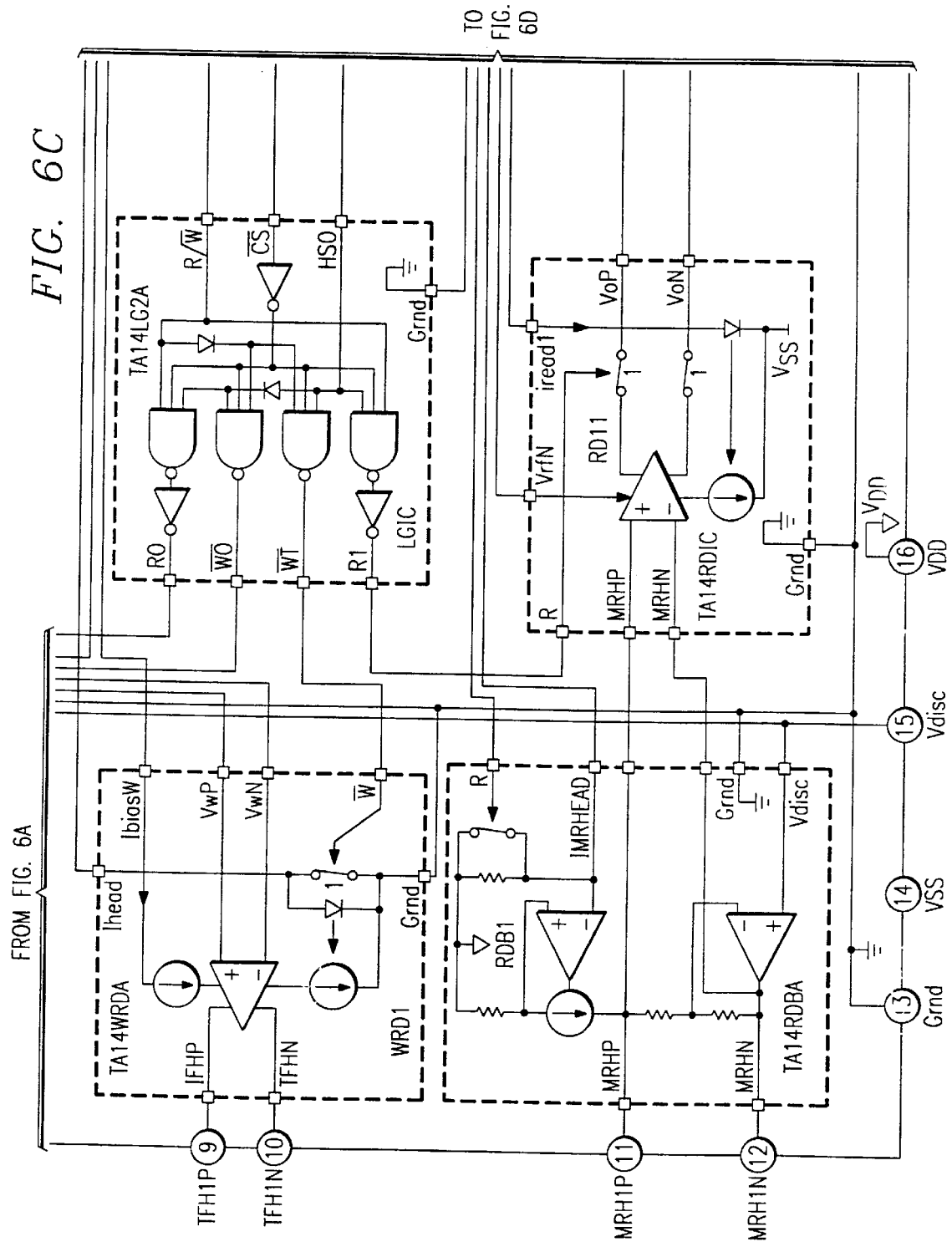
Figure 6D:
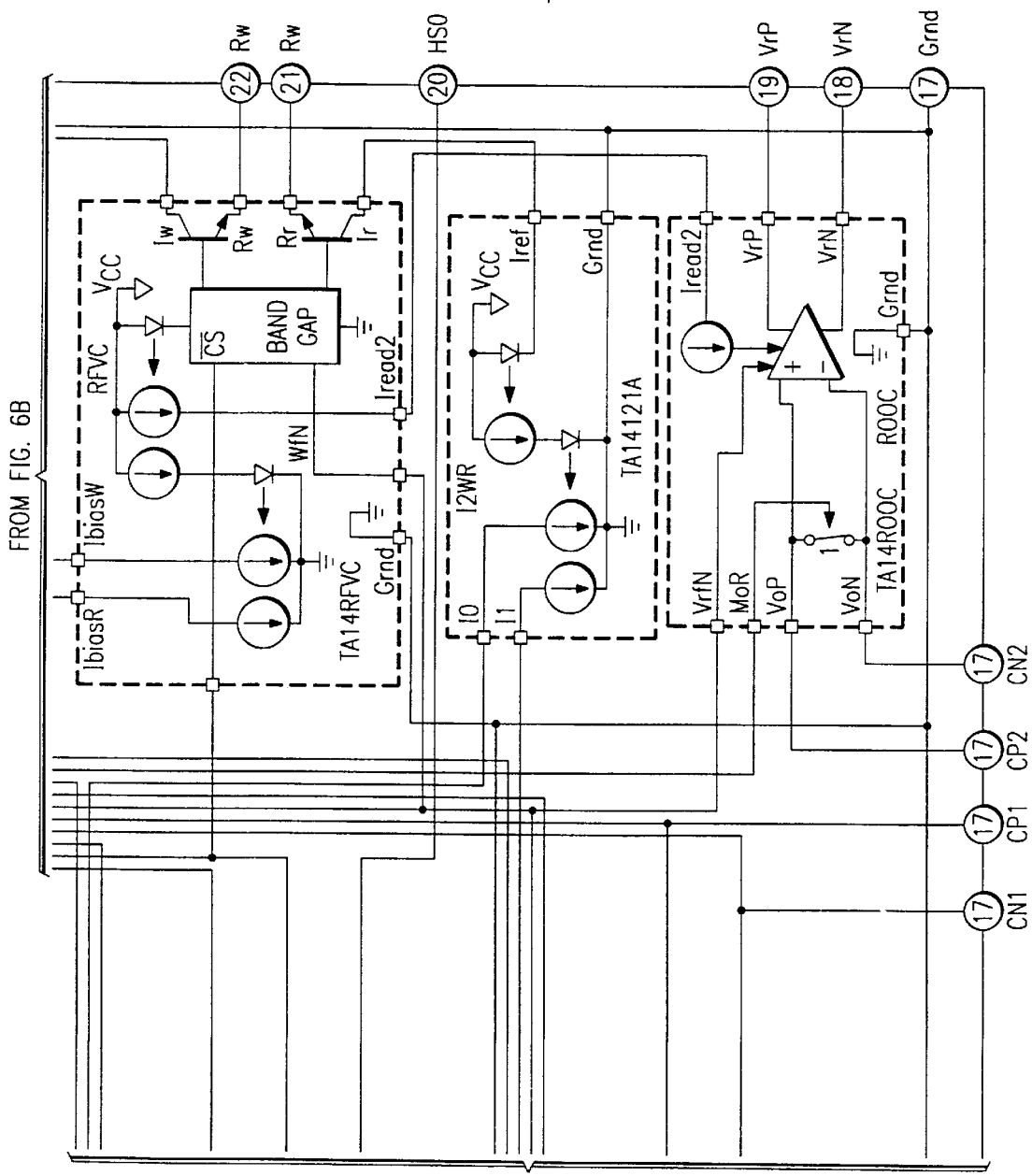

FIGS. 5A, 5B, and 5C are three parts of a single drawing, and show a sample specific implementation at the circuit level. Note that amplifier A2' compares the midpoint of the proxy loads RP1/RP2 with an external input Vdisc, which is connected to the potential of the disk drive itself. This embodiment generally corresponds to that of FIG. 3, but note that the output of amplifier A2' controls the current sourced to the high side of amplifier A1".

FIGS. 6A, 6B, 6C and 6D are four parts of a single drawing which shows a sample drive head interface chip into which head biasing circuitry like that of FIGS. 2, 3, 4, or 5A–5C may optionally be substituted for the illustrated circuit blocks RDB0 and RDB1. This interface chip includes connections (TFH1N/P and TFH2N/P) for two thin-film write heads, and also includes connections (MRH0N/P and MRH1N/P) for two magnetoresistive read heads.

Biasing for the magnetoresistive read heads is provided by circuit blocks RDB0 and RDB1. Read amplification is provided by circuit blocks RDI0/RDO0 and RDI1/RDO1. Note that the amplifier stage RDOC is fed, in this embodiment, by the output of the selected head input buffer RDI0 (connected to pins MRH1N/P for a first magnetoresistive read head) or RDI1 (connected to pins MRH1N/P for a second magnetoresistive read head).

This chip also incorporates two write amplifiers WRD0 and WRD1, which are connected to pinouts (TFH1N/P and TFH2N/P) for two thin-film write heads.

The operation of the read and write blocks is described in greater detail in the following applications, all of which have effective filing dates identical to that of the present application, and all of which are hereby incorporated by reference:

Ser. No. 08/366,793, filed Dec. 30, 1994, now U.S. Pat. No. 5,546,030, entitled "Differential High Speed Inductive Driver with a Bidirectional Current Limiting Output Stage".

Ser. No. 08/366,561, filed Dec. 30, 1994, entitled "AC Input Stage with Reduced Transient Time for Use in Multiplexing Transducers that Require a Switched DC Bias".

Ser. No. 08/366,792, filed Dec. 30 1994, now continuation application Ser. No. 08/707,655, entitled "Symmetrical Resistive Transducer Biasing Circuit and Methods".

According to a disclosed class of innovative embodiments, there is provided: A method for controlling the voltage of an intermediate point, which has no direct connection thereto, in an electrically conductive element having a potential between the ends thereof, comprising the steps of: driving said electrically conductive element with a first current, from one or more amplifiers; driving a proxy load element, which has one or more intermediate tap points, with a current which is proportional to said first current; monitoring the voltage of one of said intermediate tap points of said proxy load element, and controlling the output of said amplifiers to drive the voltage of said one intermediate tap point toward a reference value; whereby the voltage of said intermediate point is driven toward a constant voltage which is determined by said reference value.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, the disclosed method of regulating an inaccessible intermediate point on a load by use of a "proxy load" can also (alternatively and less preferably) be applied to reactive loads, as long as a tapped proxy element, with approximately the same reactance angle $Z/|Z|$ as the actual load, is available (on-chip if need be).

For example, the regulated point on the resistor does not strictly have to be the exact centerpoint, but could alternatively and less preferably be anywhere in the middle third of the range of potentials which exists across the length of the resistor, or even less preferably in the middle half. Similarly, some offset can be tolerated in the regulation loop if desired.

The proxy elements do not have to be identical (although this is preferable), and do not strictly even have to be of the same type as the primary load (although this is preferable); for example the proxy load elements may be implemented as weak transistors rather than resistors. It is not strictly necessary for the behavior of the proxy loads to track that of the primary load, since the proxy loads primarily serve merely as a voltage divider.

Similarly, it is also possible, using other circuit transformations which will be obvious to those of ordinary skill in the art, to provide other configurations which will copy the voltage of the sensing resistance (or even a voltage which is proportional to the voltage of the sensing resistance) onto a chain of proxy load elements, so that an intermediate node in the chain can be used as a controlled variable.

Similarly, the chain of proxy load elements does not have to include only two units.

What is claimed is:

1. A integrated control loop circuit, comprising:
   first and second transistors forming first and second regulated current sources, having respective first current-carrying terminals connected to opposite ends of a load element;
   a first differential amplifier connected to apply a differential signal to respective control terminals of said first and second transistors, said differential amplifier being operatively connected to sense and control the current into one end of said load element;
   a second differential amplifier connected to monitor the voltage of at least one point of said load element, and operatively connected to control the common-mode voltage of said first amplifier accordingly; and a current generator connected to draw a substantially constant current from the other end of said load element.

2. The integrated control loop circuit of claim 1, wherein said second differential amplifier is connected to sense the voltage of at least one point of a proxy load which is connected to mirror the voltage of said load element.

3. The integrated control loop circuit of claim 1, wherein said one point of said load element is the midpoint thereof.

4. The integrated control loop circuit of claim 1, wherein said first and second transistors are bipolar.

5. The integrated control loop circuit of claim 1, wherein said substantially constant current is precisely proportional to a constant reference current at an external terminal.

* * * * *

UNITED STATES PATENT AND TRADEMARK OFFICE
CERTIFICATE OF CORRECTION

PATENT NO.     : 5,770,968
DATED          : June 23, 1998
INVENTOR       : Scott Warren Cameron It is certified that the above Letters Patent is hereby corrected as shown below:

column 5, at line 40, replace ' $\frac{V_{bg}}{R_{ext}}\left(\frac{R_{Ref}}{R_{Head}}\right)$ ' with -- $\frac{V_{bg} - V_{be}}{R_{ext}}\left(\frac{R_{Ref}}{R_{Head}}\right)$ -- column 6, at line 14, delete the words 'a couple of'.

column 6, at line 40, following the word 'voltage', insert the word

Signed and Sealed this

Twenty-fourth Day of November, 1998

Attest:

BRUCE LEHMAN

*Attesting Officer*     *Commissioner of Patents and Trademarks*